US006710408B2

(12) United States Patent
Lim et al.

(10) Patent No.: US 6,710,408 B2
(45) Date of Patent: Mar. 23, 2004

(54) THIN FILM TRANSISTOR ARRAY SUBSTRATE FOR LIQUID CRYSTAL DISPLAY STRUCTURE

(75) Inventors: Byoung-Ho Lim, Kyoungsangbuk-do (KR); Yong-Wan Kim, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/171,767

(22) Filed: Jun. 17, 2002

(65) Prior Publication Data

US 2002/0171108 A1 Nov. 21, 2002

Related U.S. Application Data

(62) Division of application No. 09/729,725, filed on Dec. 6, 2000, now Pat. No. 6,448,579.

(51) Int. Cl.[7] .............................................. H01L 27/01

(52) U.S. Cl. ........................ 257/347; 257/72; 257/75; 257/68

(58) Field of Search ............................. 257/347, 70–75, 257/59–68, 77; 438/149, 150, 479, 517, 48, 128, 283, 59

(56) References Cited

U.S. PATENT DOCUMENTS 5,182,661 A * 1/1993 Ikeda et al. .................... 359/54
5,811,318 A    9/1998 Kweon

OTHER PUBLICATIONS

U.S. patent application Ser. No. 09/729,725, Lim et al., pending.

* cited by examiner

Primary Examiner—Carl Whitehead, Jr.
Assistant Examiner—Yennhu B Huynh
(74) Attorney, Agent, or Firm—McKenna Long & Aldridge LLP

(57) ABSTRACT

The present invention discloses a TFT array substrate (and method for making the same) having the large storage capacitance for use in a liquid crystal display device. In a four-mask process, the conventional storage capacitor of the TFT array substrate includes the capacitor electrodes and the insulation layer and semiconductor layer as a dielectric layer. However, the present invention includes the capacitor electrodes and the insulation layer as a dielectric layer so that the thickness of the dielectric layer becomes thinner. Therefore, much more electric charges can be stored in the storage capacitor. That means the liquid crystal display device can have a high picture quality and a high definition. Moreover, the present invention has a structure that can achieve the high manufacturing yield.

6 Claims, 10 Drawing Sheets

THIN FILM TRANSISTOR ARRAY SUBSTRATE FOR LIQUID CRYSTAL DISPLAY STRUCTURE

This is a division of application Ser. No. 09/729,725 filed Dec. 6, 2000 now U.S. Pat. No. 6,448,579.

BACKGROUND OF THE INVENTION

1. Field of the Invention

The present invention relates to a Liquid Crystal Display (LCD), and more particularly, to a Thin Film Transistor (TFT) array substrate and a method of fabricating the same.

2. Description of Related Art

Generally, a liquid crystal display (LCD) comprises upper and lower substrates opposing each other with liquid crystal interposed there between, and a thin film transistor (TFT) addressing the voltage to the liquid crystal. On the lower substrate, a plurality of gate lines extending in one direction and a plurality of data lines extending in perpendicular direction to the gate lines are formed. In this matrix arrangement, a plurality of TFTs are disposed near the crossover points of the data and gate lines.

Nowadays, the liquid crystal display (LCD) is used for a portable computer such as a laptop computer and is becoming large from the beginning of simple display devices to large size display. The large-sized LCD employs an active matrix array substrate including numerous pixel regions, data and gate lines crossed each other to define the pixel regions, and TFTs (switching device) positioned near the crossover points of the data and gate lines.

In this active matrix type liquid crystal display, a high picture quality and a high definition are current important problems. For this purpose, a method of providing a storage capacitor in parallel with a pixel electrode has been known.

In general, without the storage capacitor, the electric charges of the first signal applied through the TFT for switching the liquid crystal will leak out in a short time after applying the first signal. Therefore, before applying the second signal, the capacitor in parallel with the pixel electrode should be provided to keep up the first electric charges.

In general, for the capacitor the gate line acts as one capacitor electrode and the pixel electrode acts as the other capacitor electrode.

FIG. 1 is a partially enlarged plan view illustrating the array substrate of a conventional active matrix type LCD having a pixel region "P", a storage capacitor "C", a TFT "A" and the gate and data lines 35 and 49. A drain electrode 47 of the TFT "A" is connected to a pixel electrode 40 of the pixel region "P" via a contact hole 57.

A semiconductor channel region 53 is formed between source and drain electrodes 45 and 47 by exposing the portion of the intrinsic semiconductor layer 39. Ohmic contact regions are formed between the intrinsic semiconductor layer 39 and the source and drain electrodes 45 and 47. And gate and data pads (not shown) are formed at one end of the gate and data lines 35 and 49.

FIGS. 2a to 2f cross-sectional views taken along line I—I of FIG. 1, illustrating process steps of fabricating a TFT array substrate using a conventional four-mask process.

Referring to FIG. 2a, a first metallic layer (not shown) is formed on a substrate 31 and is patterned using a first mask process to form the gate pad (not shown), gate electrode 33 and gate line 36. The first metallic layer is made of a metallic material having a low resistance, such as Aluminum (Al) or Al-alloy. When the gate line is used for the capacitor electrode, the time constant of the gate line increases. Thus, the material having the low resistance such as Aluminum is preferably used for the gate line. This means that Aluminum can decrease the time constant compared with the material having a high resistance such as Tantalum (Ta) or Chrome (Cr).

The gate electrode 33 extended from the gate line 36 is formed at the corner of the pixel region. Referring back to FIG. 1, a portion of the gate line 36 is used for a capacitor electrode of the storage capacitor "C".

As shown in FIG. 2b, a first insulation layer 37 is formed by depositing an inorganic substance such as Silicon Nitride ($SiN_x$) and Silicon Oxide ($SiO_2$) or an organic substance such as BCB (Benzocyclobutene) and acryl on the substrate 31 while covering the gate electrode 33 and the gate line or capacitor electrode 36. Then intrinsic semiconductor layer 39, such as pure amorphous silicon, is formed on the first insulation layer 37. Then extrinsic semiconductor layer 41, such as impurity (n+ or p+) doped amorphous silicon, is sequentially formed on the intrinsic semiconductor layer 39. Then a second metallic layer 43 made of a material such as Molybdenum (Mo), Tantalum (Ta), Tungsten (W), Antimony (Sb) and the like is formed on the extrinsic semiconductor layer 41.

Referring to FIG. 2c, the source and drain electrodes 45 and 47, data line 49 (see FIG. 1), data pad (not shown) and second capacitor electrode 51 having an island shape are formed by patterning the second metallic layer 43 and extrinsic semiconductor layer 41 using a second mask process. The source and drain electrodes 45 and 47 are spaced apart from each other to expose the semiconductor channel region 53. At this time, the extrinsic semiconductor layer 41 is removed using the source and drain electrodes 45 and 47 as a mask. Moreover, carefulness is needed, in this etching step, not to pattern the intrinsic semiconductor layer 39.

The portions of the extrinsic semiconductor layer 41, between the intrinsic semiconductor layer 39 and the source and drain electrodes 45 and 47, act as ohmic contact layers 43a and 43b, respectively.

As shown in FIG. 2d, a second insulation layer or protection layer 53 is formed on the metallic layers 45, 47 and 51 and intrinsic semiconductor layer 39.

Referring to FIG. 2e, the contact holes 55 and 57 are formed by patterning the protection layer 53. Simultaneously, the pixel region "P" are formed by patterning the protection layer 53, intrinsic semiconductor layer 39 and first insulation layer 37 using a third mask process except the region for the storage capacitor and the data line.

Referring to FIG. 2f, a transparent conductive substance such as ITO (indium-tin-oxide) is deposited and patterned using a fourth mask process. Thus, the pixel electrode 40, electrically connecting to the second capacitor electrode 51 and drain electrode 47 via contact holes 55 and 57, is formed.

FIG. 3a is an enlarged view illustrating the portion "C" of FIG. 2f and FIG. 3b is an equivalent circuit view of FIG. 3a.

As shown in FIGS. 3a and 3b, the storage capacitor "C" includes the first capacitor electrode or the gate line 36. It also includes the second capacitor electrode 51 (having a contact with the pixel electrode 40), first insulation layer 37 (which stores the electric charge as a dielectric layer) and semiconductor layer 42 (the intrinsic and extrinsic semiconductor layers 39 and 41 as a dielectric layer).

According to the conventional method for manufacturing the TFT array substrate using the four-mask process, the process steps are decreased. However, the storage capacitance is also decreased compared to that of the array substrate manufactured using the five-mask process. For better description, the storage capacitance is represented by the following equation:

$$C_{st} = \frac{\varepsilon \cdot A}{d} \quad (1)$$

In the above equation (1), where "$C_{st}$" denotes capacity, "$\varepsilon$" denotes a dielectric constant, "d" represents the thickness of the dielectric layer and "A" represents the area of the capacitor electrode. As described in the Equation (1), the storage capacitance "$C_{st}$" is in proportion to the amount of the area "A" and is in inverse proportion to the thickness "d" of the dielectric layer.

Therefore, due to the fact that the dielectric layer includes two layers (the first insulation layer 37 and semiconductor layer 42) between the two capacitor electrodes 36 and 51, in the conventional four-mask process, the capacitance is decreased.

SUMMARY OF THE INVENTION

In order to overcome the problems described above, a preferred embodiment of the present invention provides a method of fabricating a TFT array substrate having a large storage capacitance using the four-mask process for use in an LCD device, which has the high picture quality and high definition.

In order to achieve the above objects, in one aspect, preferred embodiment of the present invention provides a thin film transistor (TFT) array substrate, including: a substrate; a plurality of a gate lines on the substrate; a plurality of data lines crossing over the gate lines and formed over the substrate; a pixel electrode in a pixel region that is defined by crossing the data and gate lines; a TFT connecting to the pixel electrode; and a storage capacitor connecting to the pixel electrode, said storage capacitor including: the gate line on the substrate; a first insulation layer on the gate line; intrinsic and extrinsic semiconductor layers formed sequentially on the first insulation layer; a first capacitor electrode on the semiconductor layer; a second insulation layer over the first capacitor electrode and semiconductor layer; and a second capacitor electrode on the second insulation layer in a position of corresponding to the first capacitor electrode.

The TFT array substrate has a gate contact hole exposing the portion of the gate line and positioned at the one side of the first capacitor electrode. The TFT array substrate has at least one gate contact hole, and the contact hole penetrates the central part of the first capacitor electrode. The TFT array substrate includes the gate line and first capacitor electrode having electrical connection each other using a transparent conductive electrode.

In order to achieve the above object, in another aspect, the present invention provides a method of fabricating a thin film transistor (TFT) array substrate, including: providing a substrate; depositing a first metallic layer on the substrate; forming a gate electrode and gate line on the substrate by patterning the first metallic layer using a first mask process; forming a first insulation layer over the gate electrode, gate line and substrate; forming an intrinsic semiconductor layer on the first insulation layer; forming an extrinsic semiconductor layer on the intrinsic semiconductor layer; depositing a second metallic layer on the extrinsic semiconductor layer; forming a data line, source and drain electrodes and a first capacitor electrode having an island shape over the gate line by patterning the second metallic layer and extrinsic semiconductor layer using a second mask process; forming a second insulation layer over the data line, source and drain electrodes and first capacitor electrode; forming a drain contact hole by patterning the second insulation layer using a third mask process, simultaneously, forming a pixel region and gate contact hole by patterning the first and second insulation layers and intrinsic semiconductor layer, simultaneously, exposing the portion of the first capacitor electrode by patterning the second insulation layer; depositing a transparent conductive electrode over the entire surface; and patterning the transparent conductive electrode by using a fourth mask process to form an electrode connecting layer connecting the first capacitor electrode with the gate line, to form a pixel electrode connected to the drain electrode via the drain contact hole, and to form a second capacitor electrode extended from the pixel electrode, overlapping the first capacitor electrode and spaced apart from the electrode connecting layer.

In the method of fabricating the TFT array substrate, the gate electrode is made of Aluminum (Al) or Al-alloy. The method of fabricating the TFT array substrate further comprises the step of forming the gate contact hole exposing a portion of gate line and positioned at the one side of the first capacitor electrode by patterning the intrinsic semiconductor layer and first insulation layer. The method fabricates at least one gate contact hole. The contact holes penetrate the central part of the first capacitor electrode and are formed over the gate electrode spaced apart each other. The method further comprises the steps of fabricating a storage capacitor wherein including the second capacitor electrode formed on the second insulation layer over the first capacitor electrode.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which:

FIG. 3b is an equivalent circuit view of FIG. 3a.

FIG. 6b is an equivalent circuit view of FIG. 6a.

DETAILED DESCRIPTION OF PREFERRED EMBODIMENTS

In one preferred embodiment of the present invention, provided is a thin film transistor (TFT) array substrate having a large storage capacitance and made by using a four-mask process.

Figure 4:
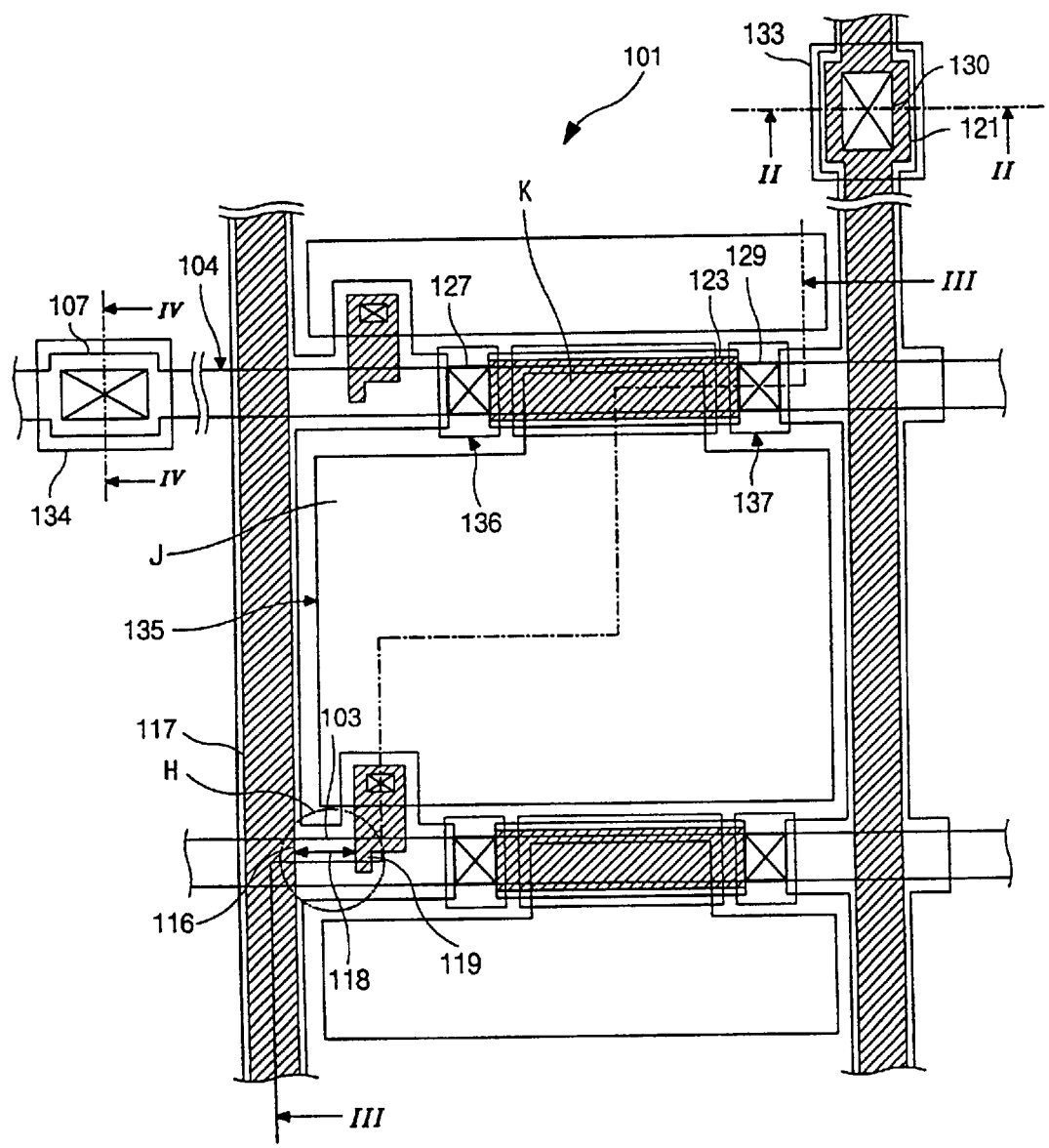
FIG. 4 is a partial plane view illustrating the TFT array substrate of a first preferred embodiment of the present invention.

FIG. 4 is a plane view illustrating a portion of the TFT array substrate 101 of a first preferred embodiment of the invention. The TFT array substrate 101 includes a TFT "H", storage capacitor "K", gate line 105, data line 107, gate pad 107 and data pad 121.

Figure 1:
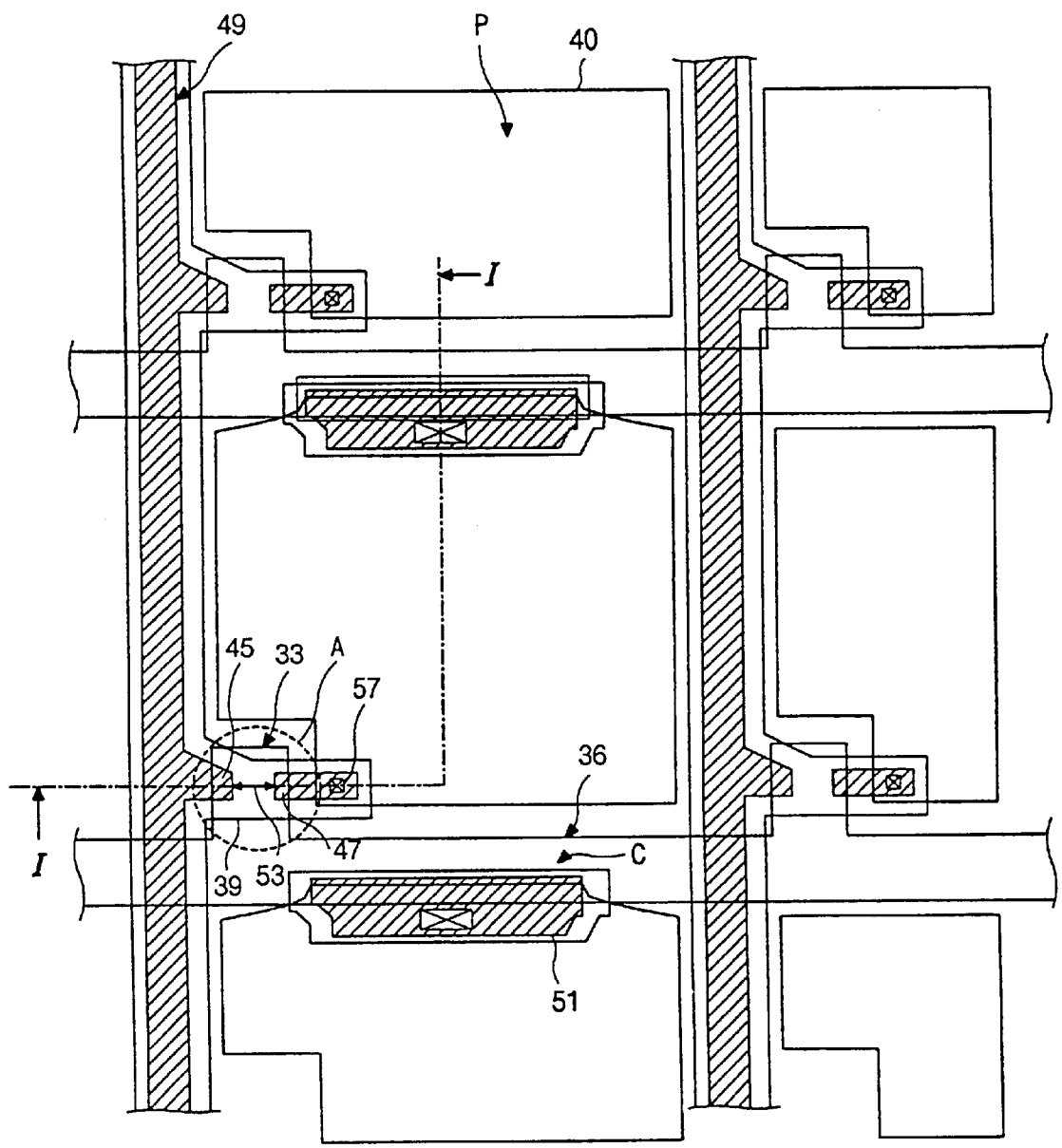
FIG. 1 is a partial plane view illustrating the TFT array substrate of a conventional active matrix type LCD.
Figure 2A:
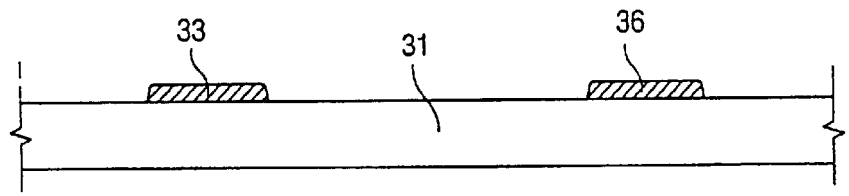
FIGS. 2a to 2f cross-sectional views taken along line I—I of FIG. 1, illustrating process steps of fabricating a TFT using a conventional four-mask process.
Figure 2B:
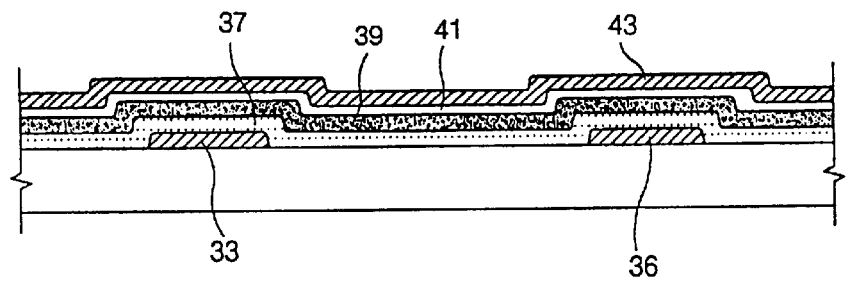
Figure 2C:
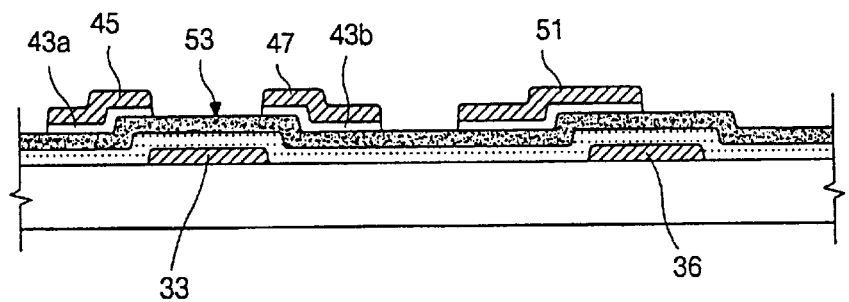
Figure 2D:
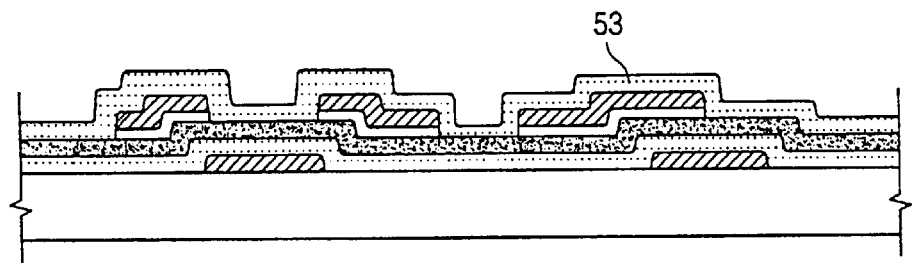
Figure 2E:
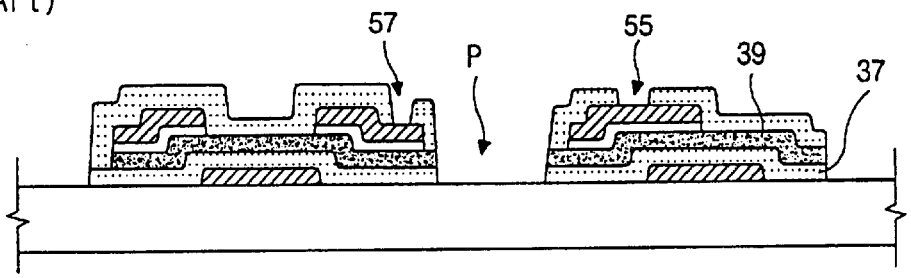
Figure 2F:
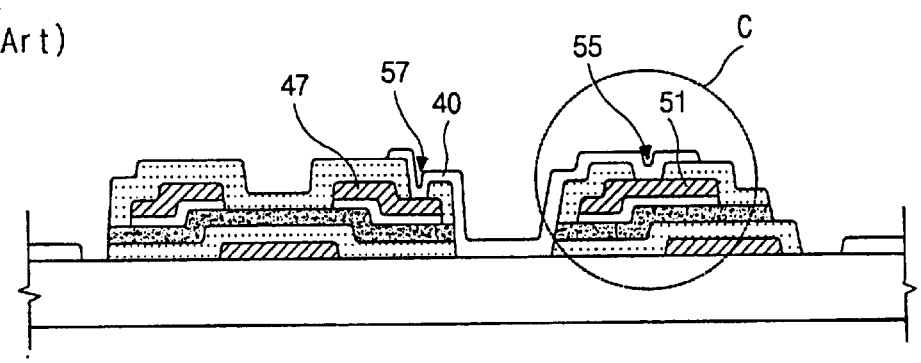
Figure 3A:
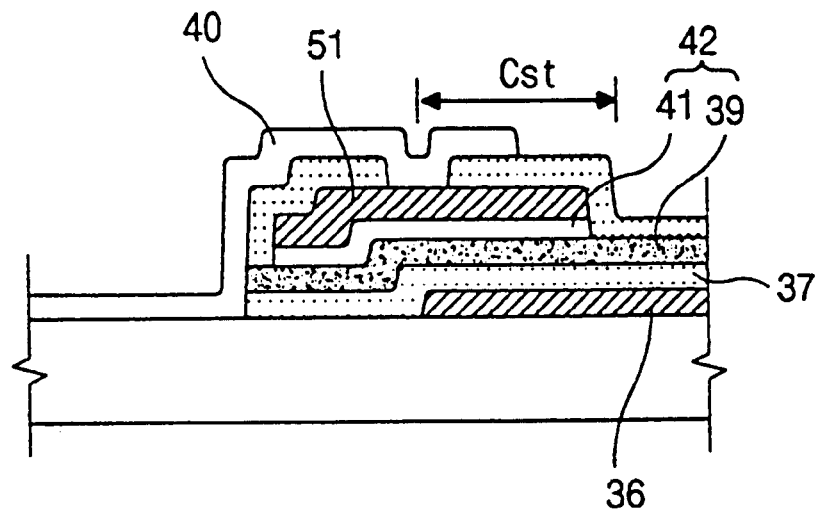
FIG. 3a is an enlarged view illustrating the portion "C" of FIG. 2f.
Figure 3B:
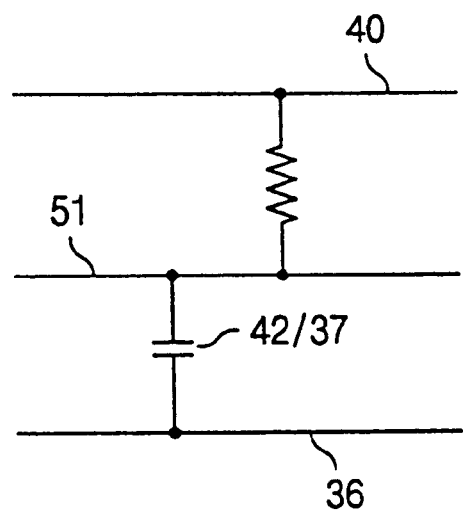

FIGS. 5a to 5g are cross-sectional views taken along line II—II (the data pad), line III—III (the TFT, pixel region and storage capacitor) and line IV—IV (the gate pad) of FIG. 1, illustrating process steps of fabricating a TFT array substrate according to the first embodiment.

Figure 5A:
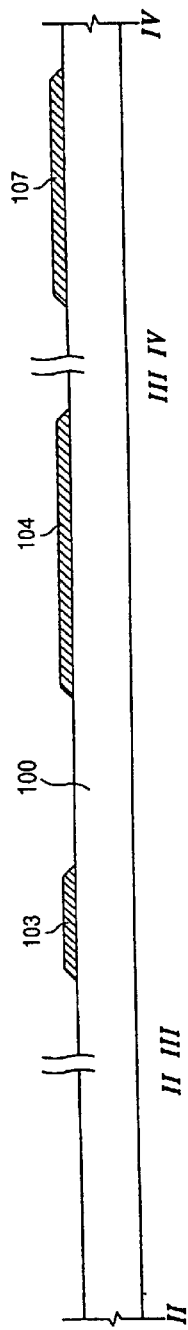
FIGS. 5a to 5g are cross-sectional views taken along line II—II, line III—III and line IV—IV of FIG. 1, illustrating process steps of fabricating a TFT array substrate according to the first embodiment.

A first metallic layer (not shown) such as Aluminum (Al) or Al-alloy is deposited on the substrate 100. As shown in FIG. 5a, the gate line 104, the gate pad 107 and the gate shorting line (not shown) are formed by patterning the first metallic layer using a first mask. The plural gate pads 107 are connected with the gate shorting line (not shown). Some part of the gate line 104 is used for a gate electrode 103, and some other part of the gate line 104 under a pixel electrode 135 (see FIG. 4) acts as not only the gate line but also a first capacitor electrode of the storage capacitor "K" (see FIG. 4).

Figure 5B:
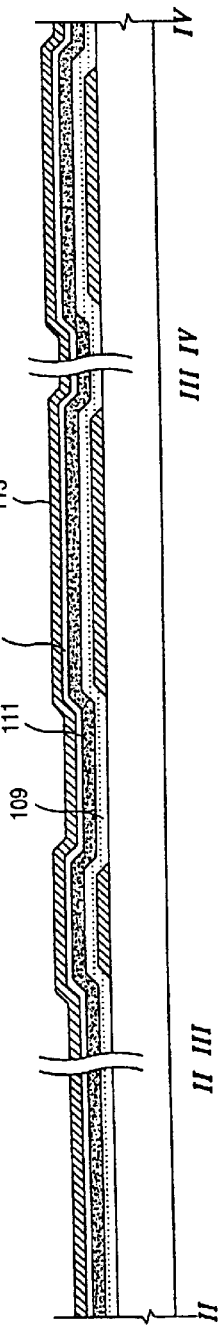

Referring to FIG. 5b, a first insulation layer 109 is formed by depositing an inorganic substance such as Silicon Nitride ($SiN_x$) and Silicon Oxide ($SiO_2$) or an organic substance such as BCB (Benzocyclobutene) and acryl on the entire substrate 100 while covering the gate electrode 103, the first capacitor electrode 104 and the gate pad 107. Then intrinsic semiconductor layer 111, such as pure amorphous silicon layer, is formed on the first insulation layer 109. Then extrinsic semiconductor layer 113, such as impurity ($n^+$ or $p^+$) doped amorphous silicon layer, is sequentially formed on the intrinsic semiconductor layer 111. Then a second metallic layer 115, made of a material such as Molybdenum (Mo), Tantalum (Ta), Tungsten (W) or Antimony (Sb) is formed on the extrinsic semiconductor layer 113.

Figure 5C:
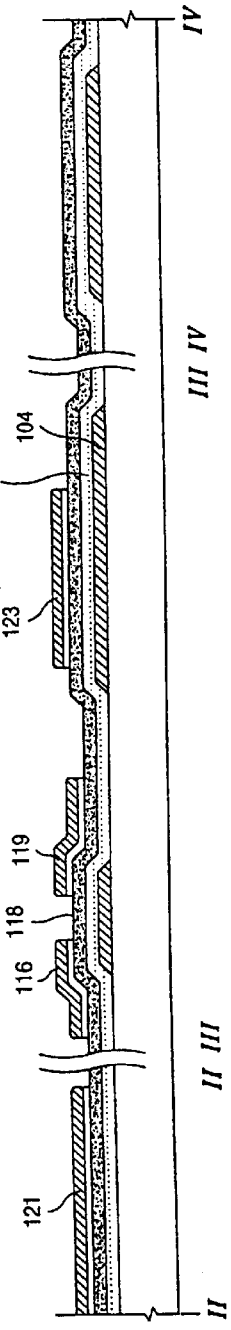

Referring to FIG. 5c, the source and drain electrodes 116 and 119, data line 117 (see FIG. 4), data pad 121 (see FIG. 4), data shorting line (not shown) and first capacitor electrode 123 having an island shape are formed by patterning the second metallic layer 115 and extrinsic semiconductor layers 113 using a second mask process. The source and drain electrodes 116 and 119 are spaced from each other to expose the semiconductor channel region 118. At this time, the extrinsic semiconductor layer 113, between the source and drain electrodes 116 and 119, is removed using the source and drain electrodes 116 and 119 as a mask.

The source electrode 116 is extended from the data line 117 (see FIG. 4). The data pad 121 is connected to the data line 117 (see FIG. 4) and transmits the external signal to the data line 117 (see FIG. 4). The portions of the extrinsic semiconductor layer 113, between the intrinsic semiconductor layer 111 and the source and the drain electrodes 116 and 119 act as ohmic contact layers.

Figure 5D:
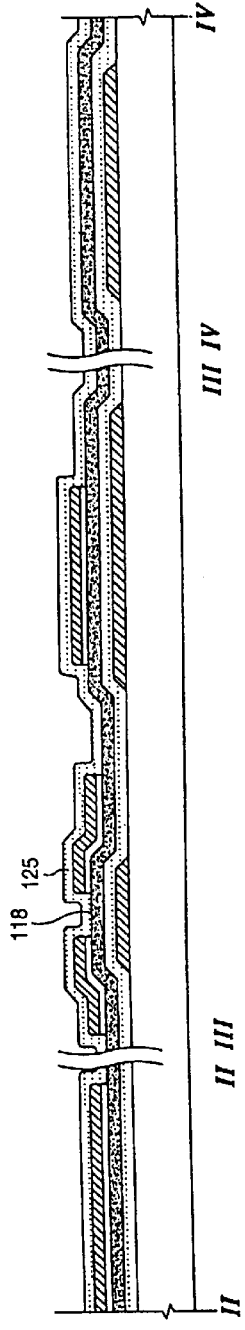

As shown in FIG. 5d, a second insulation layer or protection layer 125 is formed on the metallic layers 116, 119 and 123 and intrinsic semiconductor layer 111. The second insulation layer or protection layer 125 provides protection for the semiconductor channel region 118 when etching the array substrate, and is made of inorganic substance such as Silicon Nitride ($SiN_x$) and Silicon Oxide ($SiO_2$) or an organic substance such as BCB (Benzocyclobutene) and acryl.

Figure 5E:
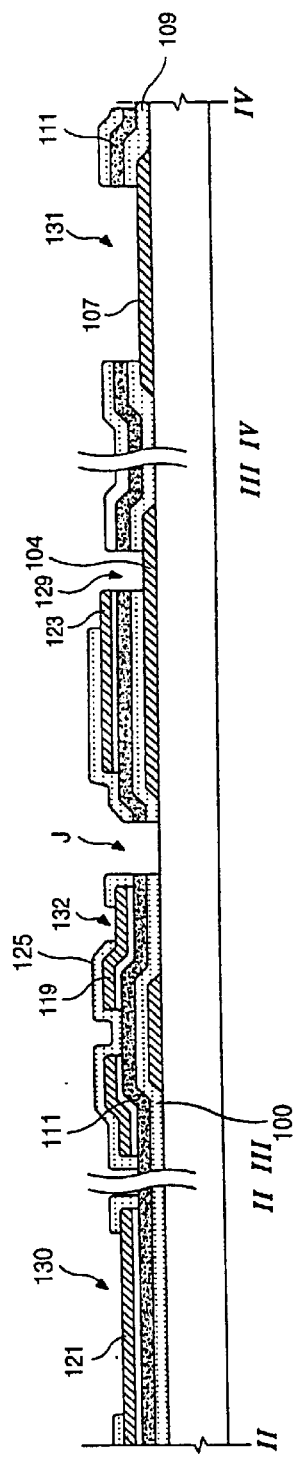

Referring to FIG. 5e, the pixel region "J" is formed by patterning the protection layer 125, intrinsic semiconductor layer 111 and first insulation layer 109 using a third mask process. Then simultaneously, the first and second gate contact holes 127 (see FIG. 4) and 129 are formed in both sides of the first capacitor electrode 123 by patterning the protection layer 125, intrinsic semiconductor layer 111 and first insulation layer 109 except the region for the storage capacitor and data line. Simultaneously, a drain contact hole 132 and data pad contact hole 130 are formed by patterning the second insulation layer or protection layer 125. Simultaneously, patterning the first and second insulation layer 109 and 125 and intrinsic semiconductor layer 111 which are positioned over the gate pad 107 forms a gate pad contact hole 131. Moreover, while forming the first and second gate contact holes 127 (see FIG. 4) and 129 at both sides of the first capacitor electrode 123, the peripheral portion of the first capacitor electrode 123 is exposed by patterning the second insulation layer 125.

Figure 5F:
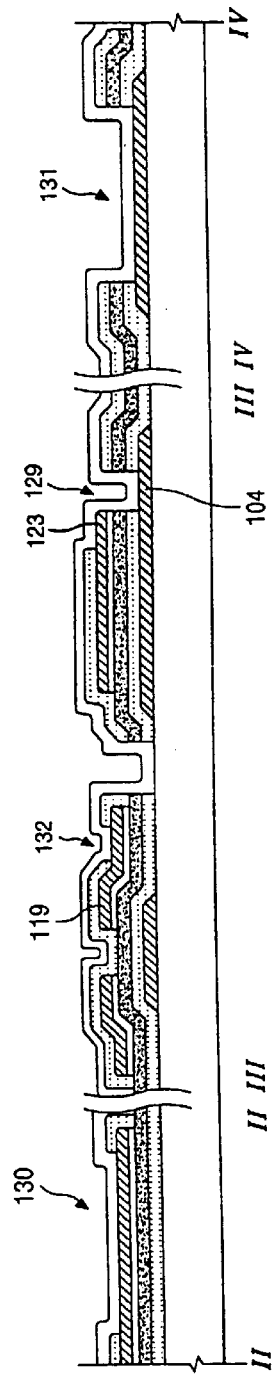
Figure 5G:
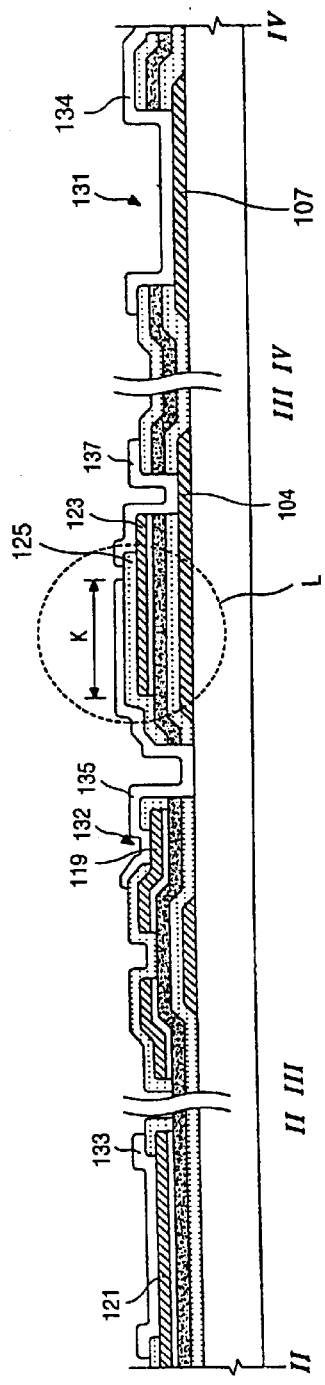

Referring to FIG. 5f, a transparent conductive substance such as ITO (indium-tin-oxide) is deposited over the entire surface, and then patterned using a fourth mask process. Thus, as shown in FIG. 5g, a data pad terminal 133 connecting to the data pad 121 via the data pad contact hole 130 and a gate pad terminal 134 connecting to the gate pad 107 via the gate pad contact hole 131 are formed. Moreover, the pixel electrode 135 connecting to the drain electrode 119 via the drain contact hole 132, extending over the first capacitor electrode and spaced apart from an electrode connecting layer 137, is formed. While patterning the transparent conductive substance, the electrode connecting layers 136 (see FIG. 4) and 137 are formed around the first and second gate contact holes 127 (see FIG. 4) and 129. The electrode connecting layers 136 (see FIG. 4) and 137 electrically connect the gate line 104 with the first capacitor electrode 123 via the first and second gate contact holes 127 (see FIG. 4) and 129. Therefore, the storage capacitor "K" is completed in the portion "L".

In this invention, the electrode connecting layers 136 and 137 prevent the gate line 104 from erosion by etchant.

Figure 6A:
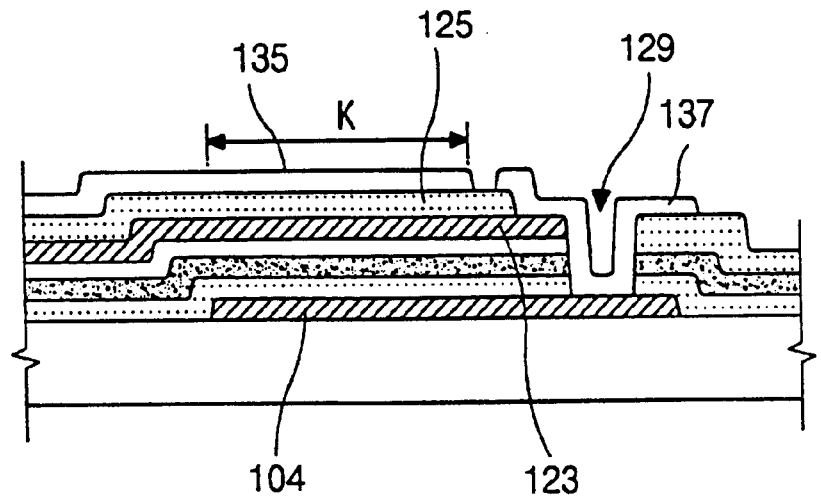
FIG. 6a is an enlarged view illustrating the portion "K" of FIG. 5g.
Figure 6B:
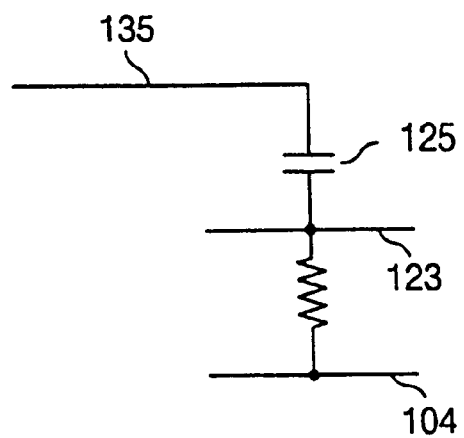

FIG. 6a is an enlarged view illustrating the portion "K" of FIG. 5g and FIG. 6b is an equivalent circuit of FIG. 6a. As shown in FIGS. 6a and 6b, the storage capacitor "K" includes the first capacitor electrode 123 which is connected to the gate line 104 using the electrode connecting layer 137 via the contact hole 129. It also includes the pixel electrode 135 as a second capacitor electrode and the second insulation layer 125 which store the electric charge as a dielectric layer. Therefore, the TFT array substrate of the present invention made by a four-mask process includes the only one dielectric layer 125 in the storage capacitor compared to the prior art. The conventional art has the storage capacitor including the semiconductor layer and insulation layer as a dielectric layer between the capacitor electrodes. However, the storage capacitor of the present invention only has the insulation layer as a dielectric layer. That means the storage capacitance can be enlarged by the following equation:

$$C_{st} = \frac{\varepsilon \cdot A}{d} \quad (1)$$

The thickness "d" of the dielectric layer 125 becomes thinner and the area "A" of the capacitor electrodes becomes larger. Therefore, the storage capacitance "$C_{st}$", which is in proportion to the amount of the area "A" and in inverse proportion to the thickness "d" of the dielectric layer, is increased.

As described above, the storage capacitor is located in the central part of the gate line. But, in a second embodiment, the storage capacitor is located at the both sides of the gate line in the pixel.

Figure 7:
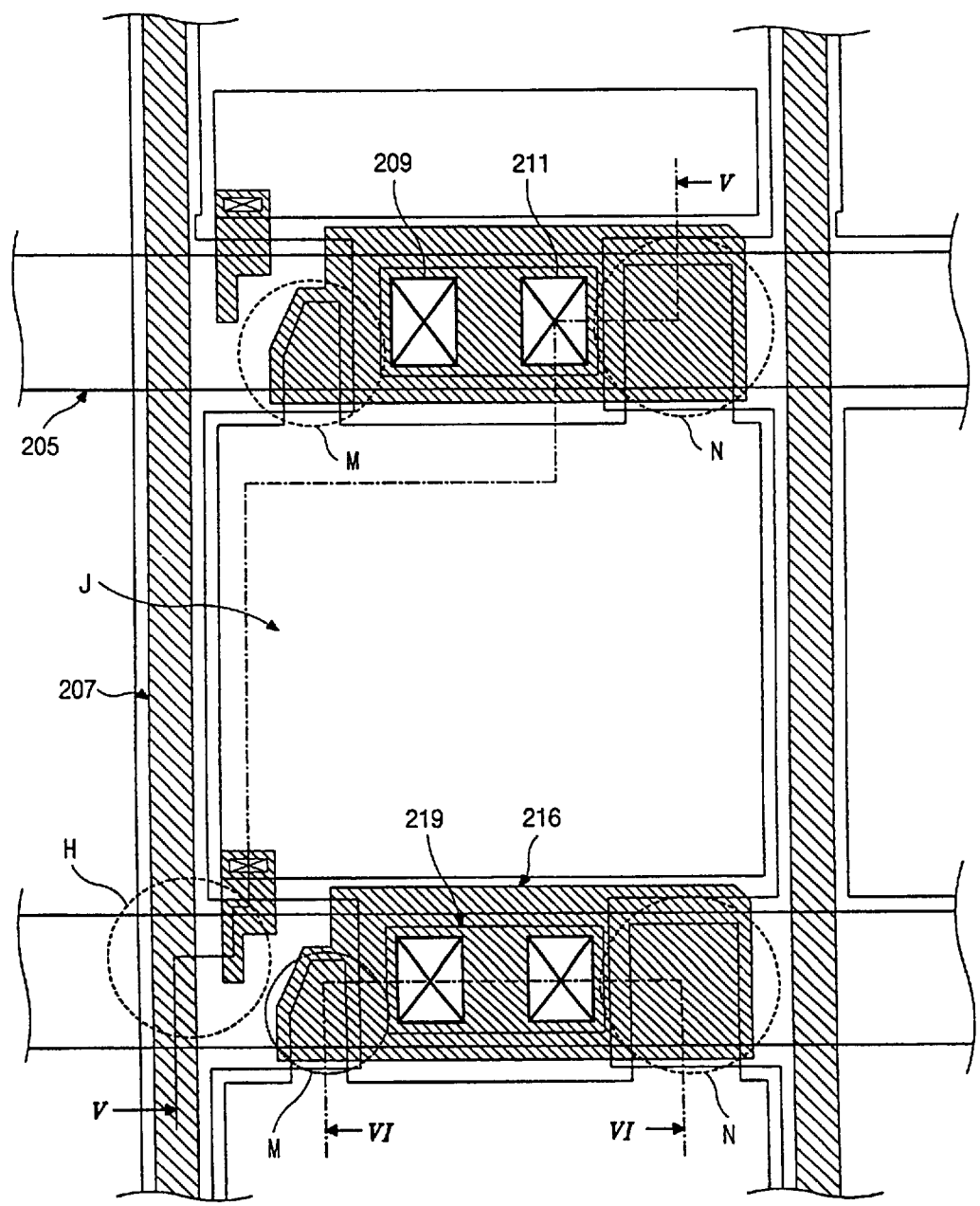
FIG. 7 is a partial plane view illustrating the TFT array substrate of a second embodiment of the present invention.

FIG. 7 is a partially enlarged plan view illustrating the TFT array substrate of a second embodiment of the present invention. The TFT array substrate includes a pixel region "J" having a pixel electrode and defined by crossing a gate line 205 and data line 207, a TFT "H" disposed near the cross point of the data and gate line and first and second storage capacitors "M" and "N". And then first and second gate contact holes 209 and 211 are positioned on the gate line 205 and between the first and second storage capacitors "M" and "N".

Figure 8:
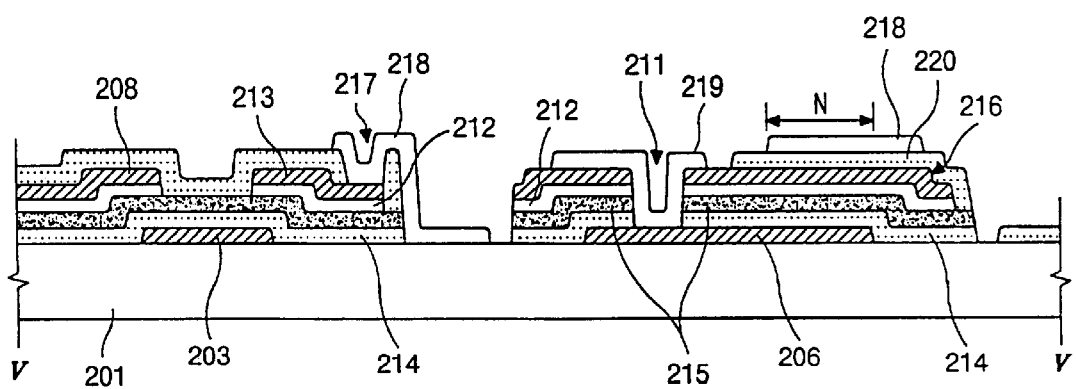
FIG. 8 is a cross-sectional view taken along line V—V of FIG. 7.

FIG. 8 is a cross-sectional view taken along line V—V of FIG. 7. In this embodiment, the process steps are similar to the first embodiment so that some of them are omitted hereinafter.

A first insulation layer 214, semiconductor layers 215 and 212 and second metallic layer are formed over a substrate 201, gate electrode 203, gate line 205 (see FIG. 7) and gate pad (not shown). Patterning the second metallic layer and extrinsic semiconductor layer 212 forms a source electrode 208 extended from the data line 207 and drain electrode 213 by using a second mask process. And then a second capacitor electrode 216 is formed in an island shape over the portion of the gate line 206.

A second insulation layer 220 that is the same substance of the first embodiment is formed over the entire substrate. A drain contact hole 217 is formed by patterning the second insulation layer 220 using a third mask process. Simultaneously, first and second gate contact holes 209 (see FIG. 7) and 211 are formed by patterning the second insulation layer 220, first capacitor electrode 216, semiconductor layers 215 and 212 and first insulation layer 214. Simultaneously, patterning the second insulation layer 220 exposes the portion of the first capacitor electrode 216. At this time, the second insulation layer 220 is removed except the peripheral portions over the gate line 206 (see FIG. 9).

A transparent conductive substance such as ITO (indium-tin-oxide) is deposited over the entire surface, and then patterned using a fourth mask process. Thus, a pixel electrode 218, electrically connecting to the drain electrode 213 via the drain contact hole 217, is formed by using a four mask process. Simultaneously, an electrode connecting layer 219 electrically connecting the gate line 206 with the first capacitor electrode 216 via the first and second gate contact holes 209 (see FIG. 9) and 211 is formed. Then, the pixel electrode 218 is spaced apart from the electrode connecting layer 219. Therefore, the gate line 206 and first capacitor electrode 216 which are electrically connected by the electrode connecting layer 219 act as a first capacitor electrode in the storage capacitor. And the pixel electrode 218 acts as a second capacitor electrode. Moreover, the second insulation layer 220 acts as a dielectric layer in the storage capacitor.

Figure 9:
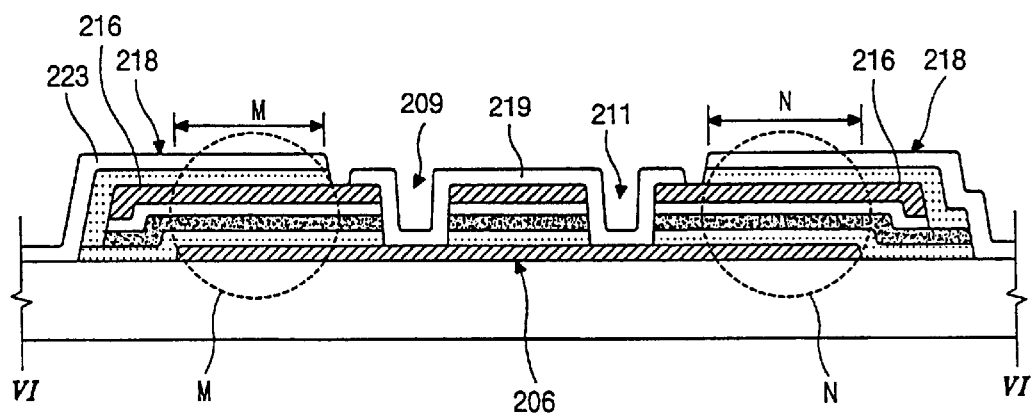
FIG. 9 is a cross-sectional view taken along line VI—VI of FIG. 7.

FIG. 9 is a cross-sectional view taken along line VI—VI of FIG. 7 illustrating two storage capacitors "M" and "N" formed in one pixel region. As shown in FIG. 9, the first and second contact holes 209 and 211 are formed over the central part of the gate line 206, and then the storage capacitors "M" and "N" are completed at the both side of the first capacitor electrode. In this embodiment, the electrode connecting layer 219 prevents the gate line 206 from erosion by etchant.

As mentioned above, in the first and second storage capacitors "M" and "N", the first capacitor electrode is the gate line 206 and the metallic layer 216 connected by the electrode connecting layer 219, and the second capacitor electrode is the pixel electrode spaced apart from the electrode connecting layer 219 and overlapping the first capacitor electrode 216.

Therefore, the TFT array substrate of the second embodiment made by a four-mask process includes the only one dielectric layer 220 in the storage capacitor compared to the prior art. Since the conventional art has the storage capacitor including the semiconductor layer and insulation layer as a dielectric layer between the capacitor electrodes, the storage capacitance of the conventional art is smaller than that of present invention.

Hence, the storage capacitance of the second embodiment can be enlarged according the above-mentioned equation (1).

As described above, the TFT array substrate for use in a liquid crystal display device according to the preferred embodiment of the present invention has a structure that obtains the high manufacturing yield and the large storage capacity. As such, the TFT array substrate of the invention prevents can help manufacturing the LCD device not having the flicker and having the high picture quality and high definition.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. An array substrate, comprising:

a substrate;

a gate line on said substrate;

a first insulating layer over said gate line;

a silicon layer over said gate line and over said first insulating layer;

two capacitor electrodes formed on said silicon layer, each at least partially over said gate line, wherein said two capacitor electrodes are spaced apart from each other;

a plurality of contact holes through said silicon layer and through said first insulating layer to said gate line;

an electrode connecting layer electrically connecting a first of said two capacitor electrodes to said gate line through a first of said plurality of contact holes;

a second insulating layer at least partially covering said two capacitor electrodes; and a first pixel electrode over said second insulating layer on said first of two capacitor electrodes and spaced apart from said electrode connecting layer;

wherein said first pixel electrode, said first of two capacitor electrodes, and said second insulating layer form a first storage capacitor.

2. An array substrate according to claim 1, wherein said electrode connecting layer further connects a second of said two capacitor electrodes to said gate line.

3. An array substrate according to claim 2, wherein said electrode connecting layer passes through said first and a second of said plurality of contact holes.

4. An array substrate according to claim 3, further including a second pixel electrode over said second insulating layer on said second of two capacitor electrodes, wherein said second pixel electrode, said second of two capacitor electrodes, and said second insulating layer form a second storage capacitor.

5. An array substrate according to claim 1, wherein said second insulating layer consists of a member from a group comprising silicon nitride, silicon oxide, BCB, and acryl.

6. An array substrate according to claim 1, wherein said first pixel electrode is transparent.

* * * * *

UNITED STATES PATENT AND TRADEMARK OFFICE
CERTIFICATE OF CORRECTION

PATENT NO. : 6,710,408 B2
DATED : March 23, 2004
INVENTOR(S) : Byoung-Ho Lim et al.

It is certified that error appears in the above-identified patent and that said Letters Patent is hereby corrected as shown below:

Title page,
Item [30], Foreign Application Priority Data, please insert the following data:
-- June 7, 1999 (KR)   Republic of Korea   1999-21033 --

Signed and Sealed this

Tenth Day of August, 2004

JON W. DUDAS
*Acting Director of the United States Patent and Trademark Office*